United States Patent
Katsumura et al.

(10) Patent No.: US 7,276,692 B2
(45) Date of Patent: Oct. 2, 2007

(54) BEAM ADJUSTING SAMPLE, BEAM ADJUSTING METHOD AND BEAM ADJUSTING DEVICE

(75) Inventors: Masahiro Katsumura, Saitama (JP); Yoshiaki Kojima, Saitama (JP); Yasumitsu Wada, Saitama (JP); Hiroaki Kitahara, Saitama (JP)

(73) Assignee: Pioneer Corporation, Tokyo (JP)

( * ) Notice: Subject to any disclaimer, the term of this patent is extended or adjusted under 35 U.S.C. 154(b) by 12 days.

(21) Appl. No.: 10/679,416

(22) Filed: Oct. 7, 2003

(65) Prior Publication Data

US 2004/0069952 A1    Apr. 15, 2004

(30) Foreign Application Priority Data

Oct. 11, 2002    (JP) .......................... P2002-298359

(51) Int. Cl.
    *H01J 37/28* (2006.01)
(52) U.S. Cl. .................................... 250/310
(58) Field of Classification Search ................ 250/306, 250/310, 311, 492.22
    See application file for complete search history.

(56) References Cited

U.S. PATENT DOCUMENTS

| 4,370,554 A | * | 1/1983 | Bohlen et al. ............ 250/491.1 |
| 4,513,203 A | * | 4/1985 | Bohlen et al. ............ 250/491.1 |
| 4,912,313 A | * | 3/1990 | Kato et al. .................. 250/307 |
| 5,430,292 A | | 7/1995 | Honjo et al. |
| 6,243,348 B1 | * | 6/2001 | Goodberlet .................. 369/101 |
| 6,426,501 B1 | | 7/2002 | Nakagawa |

FOREIGN PATENT DOCUMENTS

| DE | 3228813 A1 | 5/1983 |
| JP | 05-159735 A | 6/1993 |
| JP | 09-190792 A | 7/1997 |
| WO | WO 02/43104 A2 | 5/2002 |

OTHER PUBLICATIONS

Hitoshi Nishimura: Japanese Patent Office Examiner—Notification of Reasons for Refusal for JP Patent Application No. 2002-298359: Art 29-1, Art. 29-2, Art 38.

* cited by examiner

*Primary Examiner*—David A. Vanore
(74) *Attorney, Agent, or Firm*—Steve A. Wong; Caroline T. Do

(57) ABSTRACT

A beam adjusting sample having a flat surface being like a plate and having two edges orthogonal to each other is employed. A beam is applied to the beam adjusting sample to detect an amount of the beam passing through the beam adjusting sample. The beam vertically scans the two edges.

12 Claims, 10 Drawing Sheets

BEAM SCANNING DIRECTION

BEAM SCANNING DIRECTION

BEAM SCANNING DIRECTION

BEAM SCANNING DIRECTION

BEAM ADJUSTING SAMPLE, BEAM ADJUSTING METHOD AND BEAM ADJUSTING DEVICE

CROSS REFERENCE OF RELATED APPLICATION

This application is based on and claims priority under 35 U.S.C. §119 with respect to Japanese Patent Application No. 2002-298359 filed on Oct. 11, 2002, the entire content of which is incorporated herein by reference.

BACKGROUND OF THE INVENTION

1. Field of the Invention

The present invention relates to a beam adjusting sample, a beam adjusting method and a sample adjusting device.

2. Description of the Related Art

Conventionally, an electron beam radiating apparatus for applying an electron beam to an object and detecting the shape of the object has been well known. As the electron beam radiating apparatus of this type, a scan type electron microscope (SEM) is well known as disclosed in JP-A-5-159735 (page 2, FIG. 5).

In the scan type electron microscope, a predetermined voltage is applied between a cathode and an anode, electrons flying out of the cathode are axially adjusted by an alignment coil, converged by a focusing lens, and focused via a stigma coil, an alternation coil and an objective lens to a predetermined position of the sample, and secondary electrons generated from the sample are detected by a secondary electron detector.

Referring to FIGS. 1 and 2, an electron beam adjusting method in the electron beam radiating apparatus of this type will be described below.

First of all, an electron beam 100 is applied onto a microstructure including a plurality of latex balls of known size laid on a stage and roughly adjusted, as shown in FIG. 1. At this time, the electron beam 100 is coarsely focused on the microstructure by changing the power of the objective lens in the electron beam radiating apparatus while seeing an image produced based on the detected secondary electrons.

If the focal point of the electron beam 100 is adjusted approximately on the latex balls 110, the beam diameters of electron beam in the x and y directions are adjusted to make the spot shape of electron beam almost circular. FIGS. 2 and 3 are views for explaining the beam diameter adjustment using a cross wire. In FIG. 2, two wires 120 and 130 crossed at right angles and a Faraday cup 140 placed directly under the wires 120 and 130 are shown.

The wires 120 and 130 are made of tungsten, for example, with the thickness being about 30 μm. The wires 120 and 130 extend in the x and y directions orthogonal to each other. In the adjustment using this cross wire, the electron beam 100 is scanned to stride the wires 120 and 130 along the x and y directions, and an amount of electron beam incident upon the Faraday cup 140 disposed under the crosswire is converted into an electrical signal. The electrical signal is amplified by an amplifier 150, passed through a low pass filter 160 for the wave form processing, and displayed on an oscilloscope 170.

FIGS. 4A to 4C are typical views showing the relationship between the electron beam 100 incident on the Faraday cup 140 and the wires 120 and 130. For simplification, a wire 120 is taken as an example here. As shown in FIG. 4A, if the electron beam 100 is totally applied over the wire 120, the electron beam 100 is obstructed by the wire 120, and does not enter the Faraday cup. This state is defined as state A. Next, if the electron beam 100 is applied near an edge of the wire 120, a partial electron beam 101.passes by the wire 120 to enter the Faraday cup, while a remaining electron beam 102 is scattered by the wire 120 to produce scattered electrons 103. This state is defined as state B. Moreover, when the electron beam 100 is not applied to the wire 120, but totally passes by, all the electron beam 100 is incident on the Faraday cup 140. This state is defined as state C.

FIG. 5 is a graph showing an output waveform of the Faraday cup 140 when one of the wires 120 and 130 is continuously scanned using the electron beam 100. In the graph of FIG. 5, the axis of abscissas is the beam scan position, and the axis of ordinates is the output of the Faraday cup 140, in which "A", "B" and "C" on the axis of abscissas correspond to the states as shown in FIGS. 4A to 4C. As shown in FIG. 5, the output of the Faraday cup 140 rapidly rises from state A to state C. In the adjustment, the beam profile is assumed to be Gaussian, and the width between the beam position at which the output of the Faraday cup 140 is 12% and the beam position at which it is 88% is defined as a beam diameter. The adjustment is made in each of the x and y directions to minimize the beam diameter and make the beam diameter almost equal to produce an almost circular spot electron beam with high precision.

However, with the above method, when the coarse adjustment using the latex balls is insufficient, it is required to repeat the adjustment many times to continue the operation, until an excellent beam diameter is obtained, which takes a quite enormous time. Also, this adjustment needs some experience, and is not treated simply.

With the cross wire method, though two wires are employed to measure the beam diameters in the x and y directions, the measurement height is different in the adjustment in the x and y directions by an amount of wire width, because the wire has a width, as shown in FIG. 3. Accordingly, the correct height position of the cross wire is not accurately measured, resulting in an error in the measurement precision.

Also, in the state B, the partial electron beam 100 is scattered as the scattered electrons 103, but part of scattered electrons 103 are scattered by the wire 120 to enter the Faraday cup 140, as shown in FIG. 4B. Accordingly, an output curve of the Faraday cup as shown in FIG. 5 is raised by part of scattered electrons and does not represent the beam profile accurately. Accordingly, it is difficult to make the measurement at high precision.

Also, the wires 120 and 130 are partially varied in the shape, the height in the z axis direction being possibly different depending on the position, whereby the measurement precision is degraded due to this height error.

SUMMARY OF THE INVENTION

This invention has been achieved in the light of the above-mentioned problems, and it is an object of the invention to solve the difficulty of making the measurement with high precision with the cross wire method.

To achieve the above object, according to one aspect of the invention, there is provided a beam adjusting method comprising: applying a beam onto a beam adjusting sample having a flat surface being like a plate and having two edges orthogonal to each other, and a step of detecting an amount of the beam passing through the beam adjusting sample, wherein the beam vertically scans the two edges.

According to another aspect of the invention, there is provided a beam adjusting sample having a flat surface being like a plate and has two edges orthogonal to each other.

According to still another aspect of the invention, there is provided a beam adjusting device comprising a stage for laying a beam adjusting sample having a flat surface being like a plate and having two edges orthogonal to each other, a beam generator for applying a beam onto the beam adjusting sample, a secondary electron detector for detecting a secondary electron generated by applying the beam, a position detector for detecting the position of the beam adjusting sample, and a beam detector disposed under the stage, wherein the beam detector detects an amount of electron beam passing through the beam adjusting sample.

BRIEF DESCRIPTION OF THE DRAWINGS

These and other objects and advantages of this invention will become more fully apparent from the following detailed description taken with the accompanying drawings in which.

DETAILED DESCRIPTION OF THE PREFERRED EMBODIMENTS

Referring to FIGS. 6 to 12, a beam adjusting sample, a beam adjusting method and a beam adjusting device according to an embodiment of the present invention.

Figure 1:
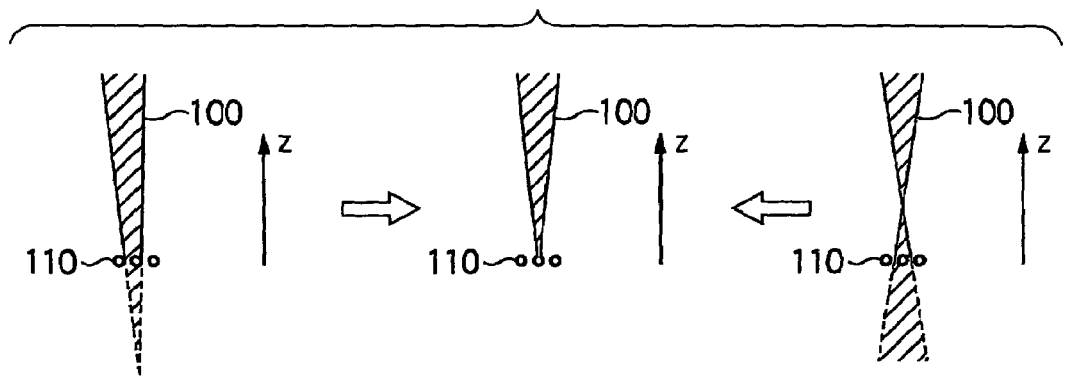
FIG. 1 is a view for explaining the coarse control of electron beam.
Figure 2:
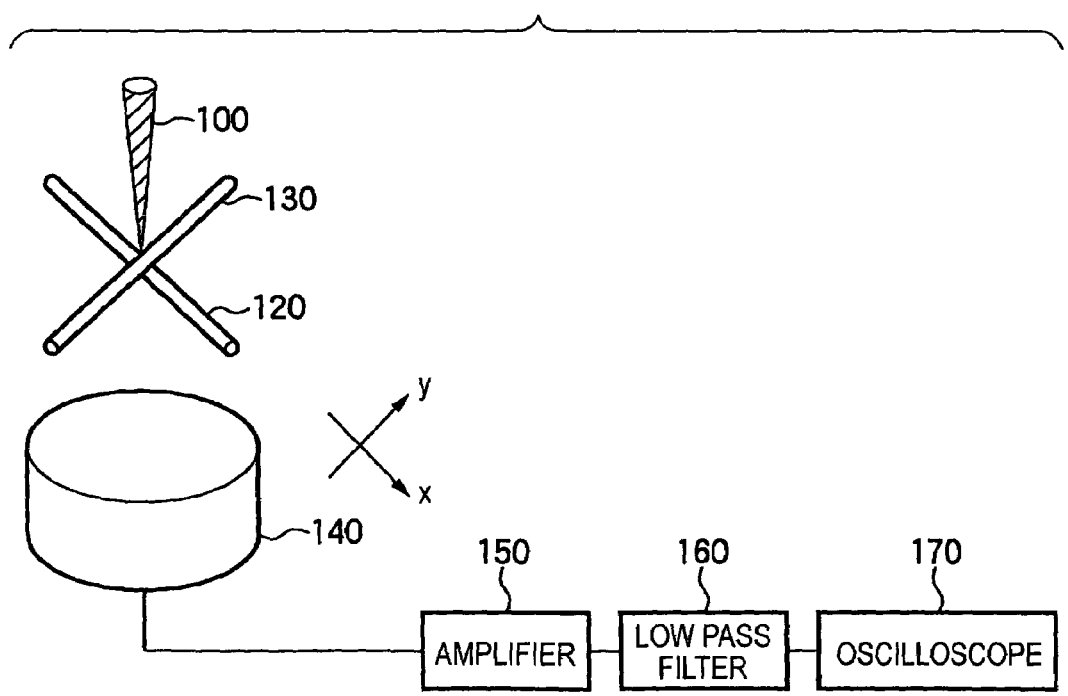
FIG. 2 is a view for explaining a method for measuring a beam diameter of electron beam using a cross wire method.
Figure 3:
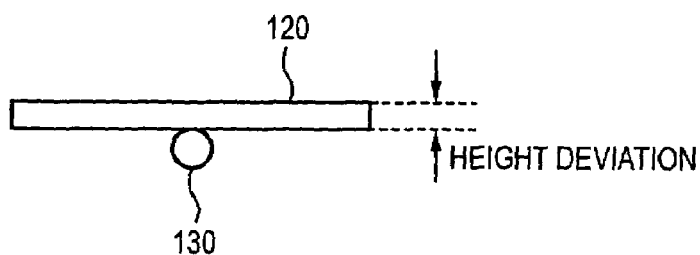
FIG. 3 is a view showing the positional relation between the cross wires.
Figure 4A:
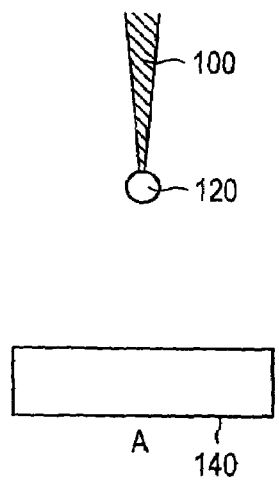
FIGS. 4A to 4C are typical views showing the relationship between electron beam incident on the Faraday cup and the wire.
Figure 4B:
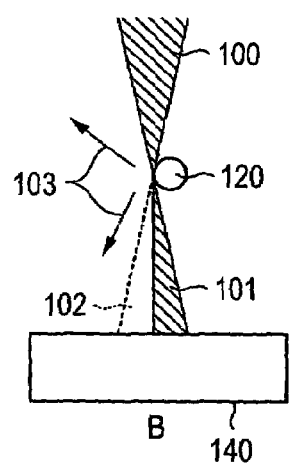
Figure 4C:
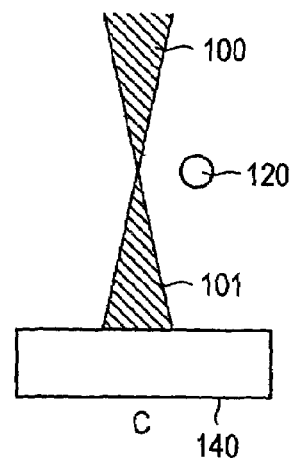
Figure 5:
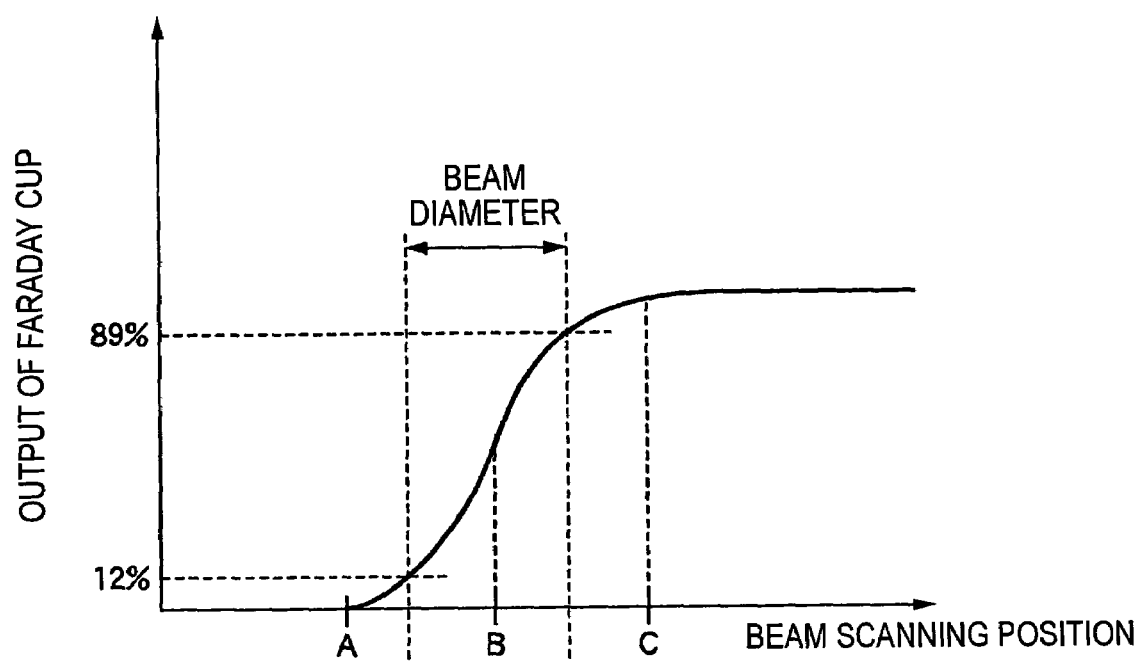
FIG. 5 is a graph showing the relationship between the beam scan position and the output of the Faraday cup.
Figure 6:
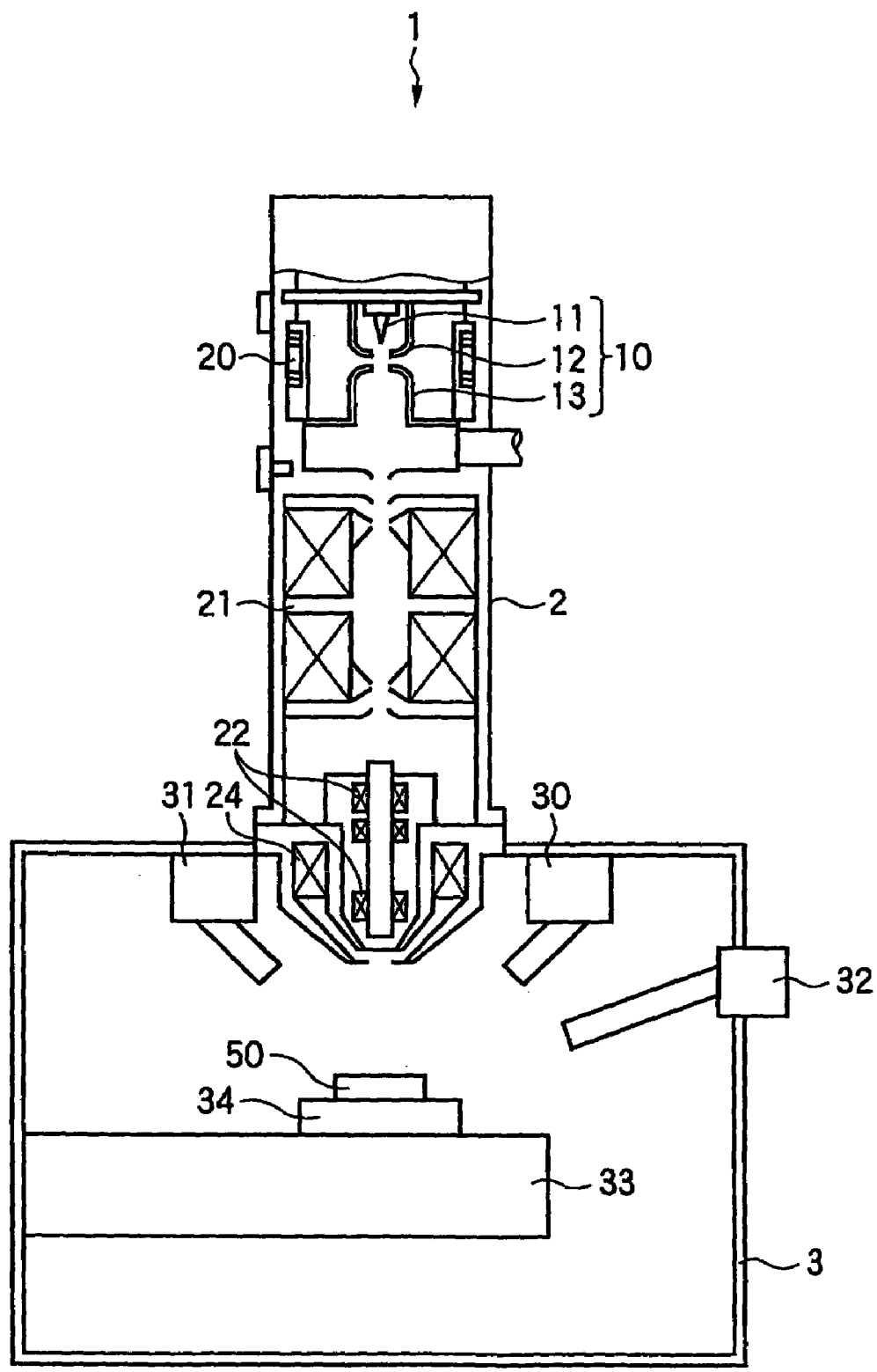
FIG. 6 is a cross-sectional view showing a beam adjusting device according to an embodiment of the invention.

FIG. 6 is a cross-sectional view showing the beam adjusting device according to the embodiment of the invention. The beam adjusting device 1 of this embodiment comprises a vacuum container 3 for laying a sample 50 thereon, and a cylindrical electron beam radiating portion 2 for radiating the electron beam toward the sample 50, in which the cylindrical electron beam radiating portion 2 is mounted on the vacuum container 3.

The electron beam radiating portion 2 comprises an electron beam source 10 for generating the electron beam, an alignment coil 20, a focusing lens 21, a stigma coil 22, a deflecting coil 23, and an objective lens 24. These coils or lenses 20 to 24 include the cylindrical coils, through which the generated electron beam is passed.

The electron beam source 10 comprises a cathode 11 disposed on the axial line of the electron beam radiating portion 2, a Wehnelt 12 for covering the side face of the cathode 11, with a certain distance off the side face, and an anode 13 disposed on the side of the vacuum container 3 rather than the cathode 11. If a predetermined voltage is applied to the cathode 11, the Wehnelt 12 and the anode 13, electrons fly out of the cathode 11. Flying out electrons are axially aligned to move to the vacuum container 3.

The focusing lens 21 focuses the electron beam axially aligned by the alignment coil 20 and converges it into the electron beam having a predetermined diameter.

The stigma coil 22 adjusts the astigmatism of the electron beam passing through the coil so that the electron beam may be symmetrical around the axis. When the astigmatism takes place by changing the parameters of various kinds of lenses or coils, the stigma coil 22 is adjusted to correct the astigmatism. This adjusting method will be described later.

The deflecting coil 23 deflects the electron beam in the x and y directions perpendicular to an incident direction of the electron beam. As a voltage applied to the deflecting coil 23 is varied, the electron beam passing through the deflecting coil 23 is changed in its travel direction under the influence of a magnetic field generated by the coil. A continuously changing alternating current of rectangular or triangular wave is applied to this deflecting coil 23 to continuously change a direction of the electron beam in accordance with a pattern of applied alternating current.

The objective lens 24 converges the electron beam and adjusts the focal point along the incident direction (z direction) of the electron beam. The objective lens 24 is adjusted to focus the electron beam on the sample 50 laid within the vacuum container 3.

The vacuum container 3 is evacuated by an exhaust tube and a vacuum pump, not shown. Inside the vacuum container 3, a stage 33 and a Faraday cup 34 are disposed along the incident direction of the electron beam. The stage 33 lays the Faraday cup 34 or the sample 50 on its upper face to be movable in the x, y or z direction, and provides a reference plane for the measurement.

The Faraday cup 34 and the sample 50 laid on the Faraday cup 34 are fixed on the stage 33. The Faraday cup 34 is a beam detector for detecting the electron beam passing through the sample 50 and converting it into an electrical signal in accordance with an amount of received beam. The Faraday cup 34 is constituted to make the sample 50 parallel to the stage 33.

A laser radiating unit 30 and a laser receiving unit 31 for measuring the upper surface position of the sample are mounted on an upper surface of the vacuum container 3. The laser radiating unit 30 radiates a laser beam to the upper face of the sample 50 laid on the Faraday cup 34. The laser receiving unit 31 receives the laser beam reflected from the sample 50 to detect the height position of the sample 50.

Also, a secondary electron detector 32 is disposed in the vacuum container 3. The secondary electron detector 32 captures secondary electrons emitted from each point of the sample 50 irradiated by the laser beam. The emission amount of secondary electrons may be increased or decreased depending on the shape of the sample surface such as the inclination or edges of the sample surface. The captured secondary electrons are amplified and displayed two-dimensionally for each captured point, whereby an image of the surface shape of the sample 50 is acquired.

Figure 7:
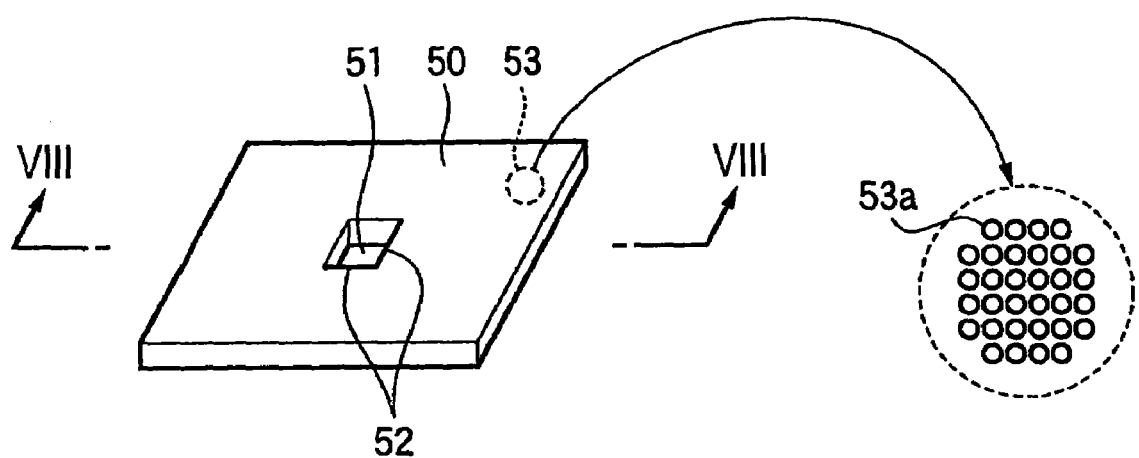
FIG. 7 is a perspective view showing a sample laid on the Faraday cup.
Figure 8A:
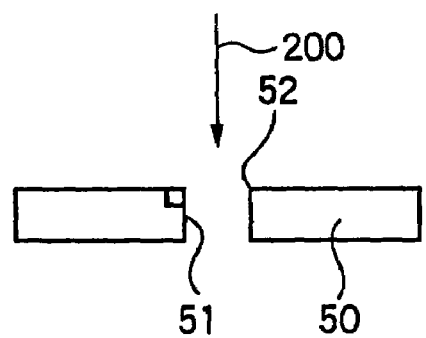
FIGS. 8A and 8B are cross-sectional views taken along the line VIII-VIII in FIG. 7.
Figure 8B:
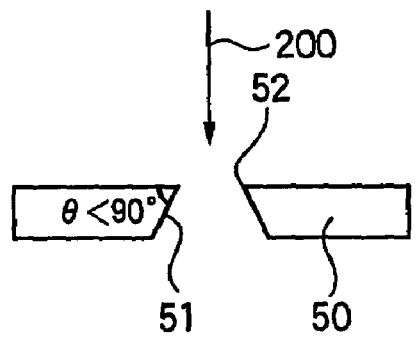

FIG. 7 is a perspective view showing the sample 50 laid on the Faraday cup 34, and FIGS. 8A and 8B are cross-sectional views taken along the line VIII-VIII in FIG. 7. The sample 50 is a plate-like silicon wafer having a flat surface, with a through hole 51 opened near the central part of the silicon wafer. Also, a microstructure 53 having a known size and including latex balls 53*a* is attached on the surface of the sample 50 near the through hole 51. The sample 50 has preferably a uniformly flat surface without regard to the position to increase the measurement precision, or conversely, a member having the flat surface may be substituted for the silicon wafer.

Herein, a film of an element having a high electron stopping power is preferably coated on the surface of the microstructure 53 of the sample 50. Since the surface of the sample 50 is irradiated repeatedly by the electron beam, the applied electron beam is embedded from the surface into the sample 50 to charge up the surface, possibly having an adverse influence on the emission amount of secondary electrons. Therefore, to prevent the charge-up of the surface, a film of an element W, Ta, Mo or Pt of high atomic number having a high electron stopping power is preferably coated on the surface. The thickness of this film is preferably 100 nm or more.

The through hole 51 has a square or rectangle shape as seen from above, the adjacent edges 52 being orthogonal. The inner side face of the through hole 51 is formed at right angles to the surface of the sample 50 as shown in FIGS. 8A and 8B. Also, the angle of the inner side face of the through hole 51 made to the surface of the sample 50 may be less than 90°, as shown in FIGS. 9A and 9B.

In this embodiment, the edges 52 of the through hole 51 in this sample 50 are employed instead of two wires with the cross wire method. FIGS. 9A and 9B are views showing the patterns of scanning the electron beam applied to the sample 50. In this embodiment, the electron beam is radiated from the surface of the sample 50 vertically across an edge 52 into the through hole 51, and then vertically across the adjacent edge 52 to the sample 50 again.

Figure 9A:
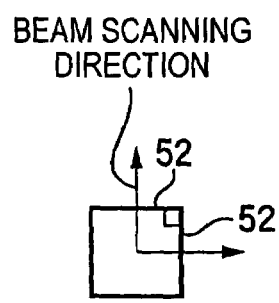
FIGS. 9A and 9B are views showing a scan pattern of electron beam applied to the sample.
Figure 9B:
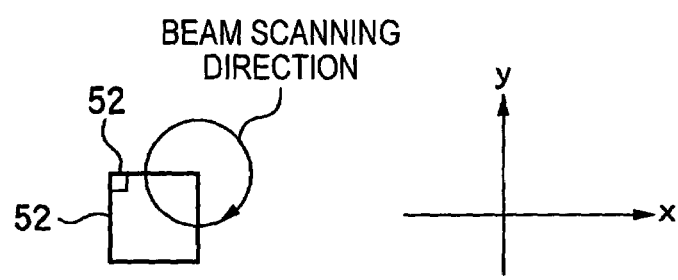

In FIG. 9A, the electron beam has its radiation direction rotated by 90° over the through hole 51, and then is moved toward the adjacent edge 52. Also, in FIG. 9B, the electron beam is radiated to draw a circular locus around a predetermined center of rotation. In FIG. 9B, the electron beam has its locus crossing vertically the edges 52.

Figure 10A:
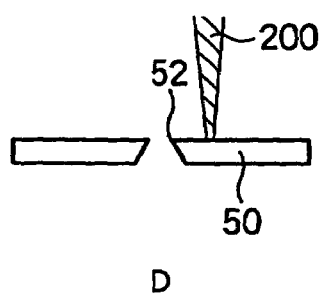
FIGS. 10A to 10C are typical views showing the relationship between an electron beam applied to the sample and an electron beam passing through a through hole.
Figure 10B:
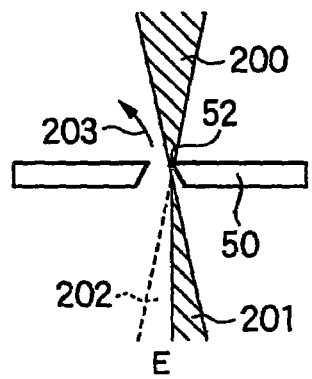
Figure 10C:
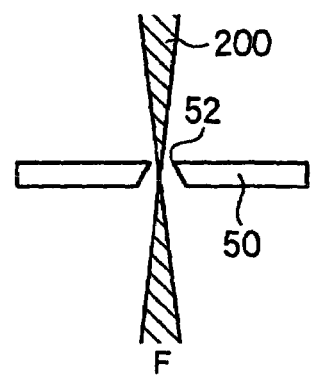

FIGS. 10A to 10C are typical views showing the relationship between the electron beam radiated to the sample 50 and the electron beam passing through the through hole 51. First of all, the electron beam 200 is radiated toward the surface of the sample 50. At this time, the electron beam 200 is impeded on the surface of the sample 50, and does not enter the Faraday cup 34 placed under it.

Then, if the electron beam 200 is radiated near the edges 52 of the through hole 51, a partial electron beam 201 passes by the edges 52 to be incident upon the Faraday cup 34, and a remaining electron beam 202 is impeded on the surface of the sample 50 near the edges 52, and scattered as scattered electrons 203. Since the scattered electrons 203 are scattered on the surface of the sample 50, almost no scattered electrons pass through the through hole 51 to enter the Faraday cup 34. This state is defined as state E.

Moreover, if the electron beam is moved to the position where it totally passes through the through hole 52, the Faraday cup 34 receives all the electron beam 200. This state is defined as state F. the above states D to F are the same, whether the electron beam 200 is moved in the x direction or the y direction.

Figure 11:
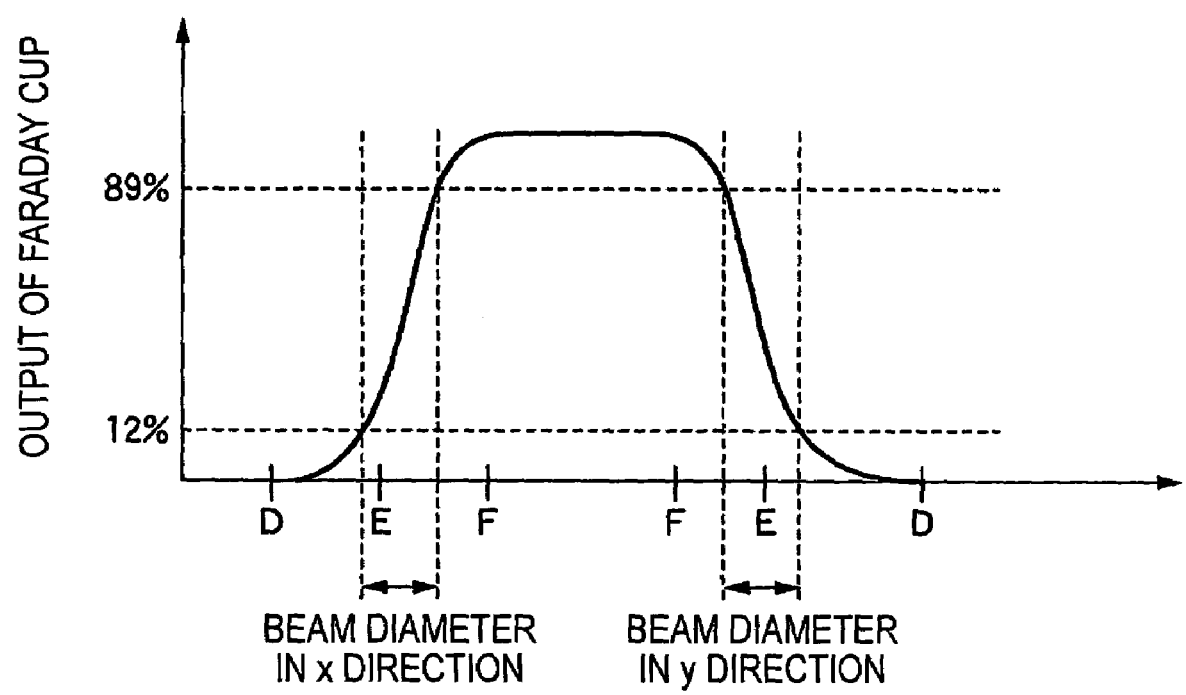
FIG. 11 is a graph showing the relationship between the beam scan position and the output of the Faraday cup.

FIG. 11 is a graph showing an output of the Faraday cup when the surface of the sample 50 is scanned along a scan path as shown in FIG. 9A, using the electron beam 200. In the graph, the axis of abscissas is the beam scan position and the axis of ordinates is the output of the Faraday cup 140, in which "D", "E" and "F" indicated on the axis of abscissas correspond to the states as shown in FIGS. 10A to 10C, respectively.

In the state D where the electron beam 200 is radiated on the surface of the sample 50, the amount of electron beam incident on the Faraday cup 34 is zero. If the electron beam 200 is moved in the x direction to the position (state E) on the edges 52 of the through hole 51, the amount of electron beam passing through the through hole 51 and entering the Faraday cup 34 is increased. And at the position (state F) where the electron beam 200 totally passes through the through hole 51, the incident amount of electron beam is not increased, and kept at a certain value.

If the movement direction of the electron beam 200 is changed to the y direction to move the electron beam 200 via the edges 52 on the surface of the sample 50 again, the output of the Faraday cup 34 is decreased to zero as shown to the right in the graph of FIG. 11.

In the adjustment of this embodiment, the beam profile is assumed as Gaussian, and the beam diameter is defined as the width between the beam position at which the output of the Faraday cup 34 is 12% and the beam position at which it is 88%. And the adjustment is made such that the beam diameter is minimized and almost equivalent in the x and y directions, whereby an almost circular spot electron beam is produced at high precision. Herein, to assure that the beam diameter in the x and y directions is almost equivalent, it is required that the output curve of the Faraday cup in FIG. 11 is symmetrical in the degree of change.

Figure 12:
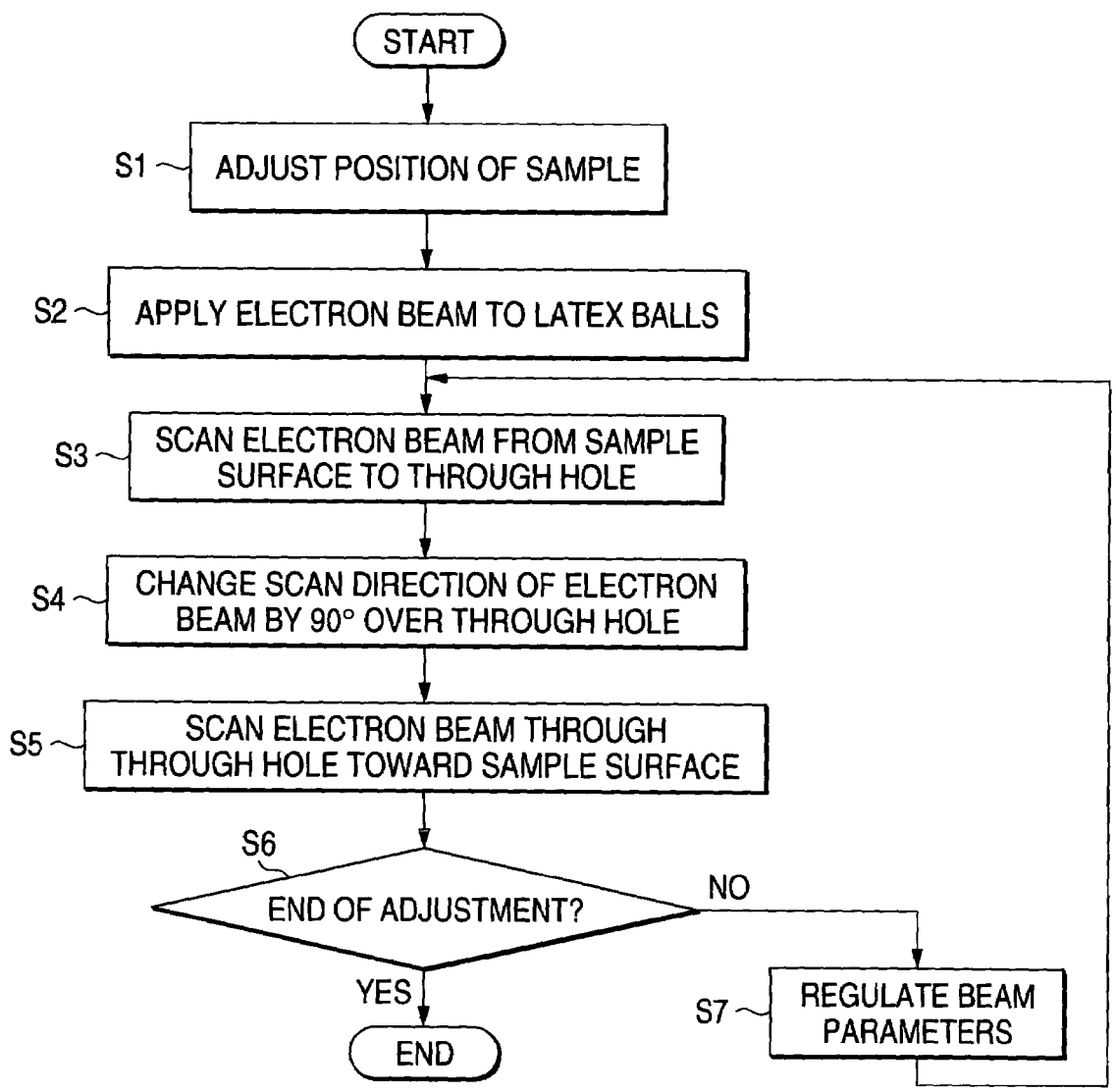
FIG. 12 is a flowchart showing a beam adjusting method according to the embodiment.

Referring to FIG. 12, the flow of a beam adjusting method of this embodiment will be detailed below in consideration of the above description.

Firstly, the Faraday cup 34 and the sample 50 are laid on the stage 33 within the vacuum container. At this time, the height position of the stage 33 is roughly adjusted to be flush with the recording (drawing) plane. At this time, the surface height of the sample 50 is measured accurately using the laser radiating unit 30 and the laser receiving unit 31 for measurement of the upper face position (step S1).

Then, the electron beam 200 is radiated to the microstructure 53 including latex balls 53*a* attached on the sample 50 to make the coarse adjustment by focusing it in the z axis direction based on a produced image of secondary electrons (step S2).

Thereafter, the stage 33 is moved in the x and y directions, so that the electron beam 200 may be positioned near the through hole 51 of the sample 50. And the electron beam is scanned and radiated from the surface of the sample 50 via the edge 52 into the through hole 51. At this time, the electron beam is moved to vertically traverse the edge 52 (step S3). If the electron beam 200 arrives near the center of the through hole 51 and gets to the position at which it totally passes through the sample 50, the scan direction of the electron beam 200 is rotated by 90° (step S4). And the electron beam is scanned and radiated in the y direction onto the surface of the sample 50 through the through hole 51 via the adjacent edge 52 near the previously passed edge (step S5). The operation from step S3 to step S5 may be ended at a time or repeated on the same path two or more times.

Thereafter, the output of the Faraday cup is confirmed to check whether or not the adjustment is ended. If the adjustment is less sufficient, the stigma coil 22 is adjusted to change the beam parameters, and the operation returns to step S3. If there is no problem, the measurement is ended.

In brief, the beam adjusting method of this embodiment includes a step of radiating electron beam to the sample 50 for beam adjustment having a flat surface of plate shape and formed with the through hole 52 opened in the thickness direction, and a step of detecting the amount of beam penetrating the sample 50 for beam adjustment through the through hole 52, in which the electron beam is radiated by changing the scan direction over the through hole 52.

According to this embodiment, the single sample 50 can be employed to make the coarse adjustment of beam in the z direction and the adjustment of beam diameter in the x and y directions. Accordingly, the operation for adjusting the beam is simplified and the time for beam adjustment is shortened.

Also, the beam diameter adjustment in the x and y directions is made by beam scan once. Since the reference plane in the x and y directions is the same surface of the sample 50, there is no height error when the adjustment is made in the x and y directions.

The sample 50 is made from a silicon wafer, with almost no height error. Moreover, since the height position of the surface of the sample 50 is accurately measured using the laser radiating unit 30 and the laser receiving unit 31, the correct beam measurement position is grasped.

Also, a film made of an element having high electron stopping power is coated on the microstructure to prevent the charge-up and make an error in the emission amount of secondary electrons smaller. Also, this film reduces a damage of the sample 50 caused by the electron charge-up, whereby the sample can have the higher durability.

The beam measuring device, the beam measuring method and the beam measuring sample of this embodiment are applicable to a scan-type electron microscope, as well as a recording apparatus for recording the information on the disk using the electron beam. The beam measuring device, the beam measuring method and the beam measuring sample of this embodiment are suitable for the recording apparatus for high density requiring the formation of minute patterns, since the electron beam is adjusted at high precision.

In the above embodiment, the sample 50 has the through hole near the central part. Besides, the electron beam may transverse vertically two orthogonal ends.

Figure 13A:
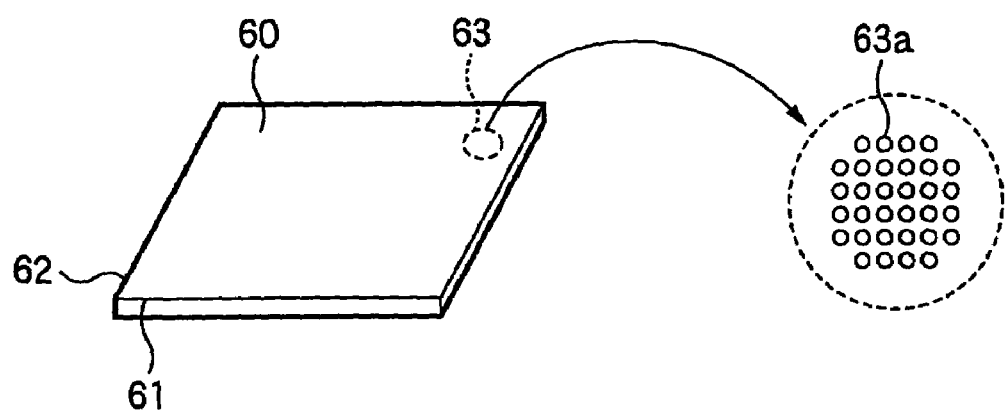
FIGS. 13A to 13C are views showing one variation of the embodiment.
Figure 13B:
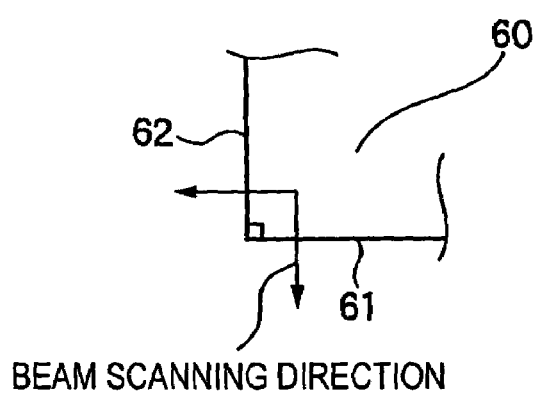
Figure 13C:
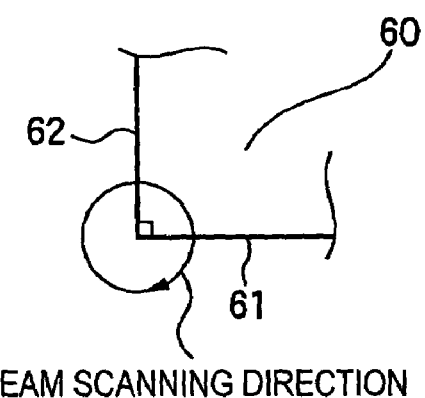

FIG. 13A is a perspective view showing a sample 60 laid on the Faraday cup 34 as one variation of the sample 50, and FIGS. 13B and 13C are views showing the scan patterns of the electron beam. The sample 60 is a silicone wafer having a flat surface and shaped like a plate. A microstructure 63 of known size including latex balls 63a is attached on the surface of the sample 60. The sample 60 has preferably a uniformly flat surface over the entire area to increase the measurement precision, or conversely a member having a flat surface may be used instead of the silicon wafer.

Herein, a film of an element W, Ta, Mo or Pt of high atomic number having a high electron stopping power is preferably coated on the surface of the microstructure 63 of the sample 60 to prevent the charge-up. The thickness of this film is preferably 100 nm or more.

The sample 60 has two adjacent edges 61 and 62 orthogonal as seen from above. The edges 61 and 62 may be perpendicular to the surface as in FIG. 8A, or may make an angle of less than 90° as in FIG. 8B.

In this variation, the electron beam is radiated from the outside of the sample 60 vertically across an edge 61 onto the surface of the sample 60, and then vertically across the adjacent edge onto the outside of the sample 60 again.

In FIG. 13B, the electron beam is rotated 90° in the radiation direction on the sample 60, and then moves to the adjacent edge. Also, in FIG. 13C, the electron beam is radiated to draw a circular locus around a predetermined center of rotation. In FIG. 13C, the electron beam has its locus crossing vertically the edges 61 and 62. In this variation, the Faraday cup 34 receives the electron beam not impeded by the sample 60 and passing through the sample 60 and measures the amount of beam. The sample 60 as constituted in this variation can provide the same effect as the sample 50.

Figure 14A:
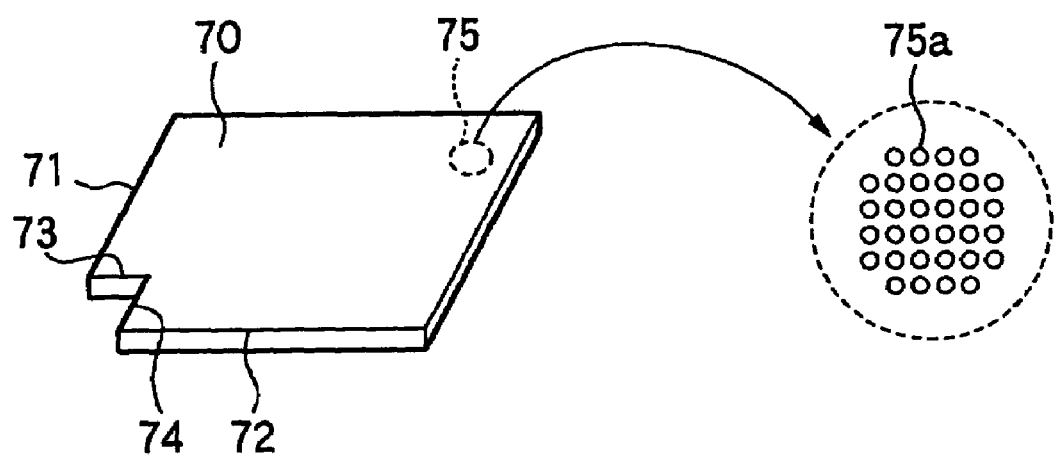
FIGS. 14A to 14C are views showing another variation of the embodiment.
Figure 14B:
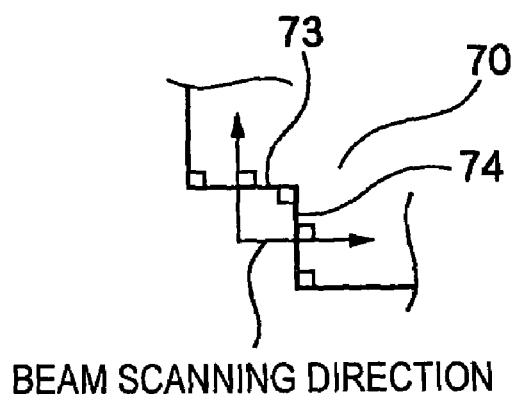
Figure 14C:
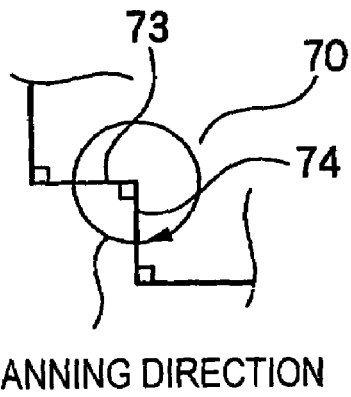

FIG. 14A is a perspective view showing a sample 70 laid on the Faraday cup 34 as another variation of the sample 50, and FIGS. 14B and 14C are views showing the scan patterns of the electron beam. The sample 70 is a silicone wafer having a flat surface and shaped like a plate. A microstructure 75 of known size including latex balls 75a is attached on the surface of the sample 70. The sample 70 has preferably a uniformly flat surface over the entire area to increase the measurement precision, or conversely a member having a flat surface may be used instead of the silicon wafer.

Herein, a film of an element W, Ta, Mo or Pt of high atomic number having a high electron stopping power is preferably coated on the surface of the microstructure 75 of the sample 70 to prevent the charge-up. The thickness of this film is preferably 100 nm or more.

The sample 70 has a corner portion crossed by two adjacent edges 71 and 72 cut away, and provided with two edges 73 and 74 orthogonal to each other. The edges 73 and 74 may be at right angles to the surface as in FIG. 8A, or may make an angle of less than 90° as in FIG. 8B.

In this variation, the electron beam is radiated from the surface of the sample 70 vertically across an edge 73 to the outside of the sample 70, and then vertically across an adjacent edge 74 onto the surface of the sample 70 again.

In FIG. 14B, the electron beam is rotated 90° in the radiation direction outside the sample 70, and then moves to the adjacent edge. Also, in FIG. 14C, the electron beam is radiated to draw a circular locus around a predetermined center of rotation. In FIG. 14C, the electron beam has its locus crossing vertically the edges 73 and 74. In this variation, the Faraday cup 34 receives the electron beam not impeded by the sample 70 and passing through the sample 70 and measures the amount of beam. The sample 70 as constituted in this variation can provide the same effect as the samples 50 and 60.

The foregoing description of the preferred embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. A beam adjusting sample including a flat surface being like a plate and having at least two edges in which adjacent edges are orthogonal to each other as viewed from above the beam adjusting sample, wherein a microstructure including latex balls is attached on the surface of the beam adjusting sample, and wherein a film of an element having a high electron stopping power is coated on a surface of the microstructure, wherein the thickness of the film is 100 nm or more.

2. The beam adjusting sample according to claim 1, wherein the beam adjusting sample is defined by the two edges, and has a through hole penetrating in the thickness direction.

3. The beam adjusting sample according to claim 1, wherein the two edges are two edges at the beam adjusting sample end.

4. The beam adjusting sample according to claim 1 wherein the attached microstructure is located near the through hole.

5. The beam adjusting sample according to claim 1 wherein the film is of one element W, Ta, Mo, Pt of high atomic number.

6. The beam adjusting sample according to claim 1 wherein the through hole is located near a central part of the sample.

7. The beam adjusting sample according to claim 2, wherein an inner side face of the through hole is formed at an angle smaller than or equal to 90 degrees to the surface of the beam adjusting sample.

8. A beam adjusting device comprising: stage for laying a beam adjusting sample as claimed in claim 1;

a beam generator for applying a beam onto the beam adjusting sample;

a secondary electron detector for detecting a secondary electron generated by applying the beam;

a position detector for detecting the position of the beam adjusting sample; and a beam detector disposed under the stage, wherein the beam detector detects an amount of electron beam passing through the beam adjusting sample.

9. The beam adjusting device according to claim 8, wherein the beam adjusting sample is defined by the two edges, and has a through hole penetrating in a thickness direction, and the beam generator applies the electron beam to have a scan direction changed over the through hole.

10. The beam adjusting device according to claim 8, wherein the two edges of the beam adjusting sample are two edges at the end of the beam adjusting sample, and the beam generator applies the beam to have the scan direction changed over the beam adjusting sample or outside the beam adjusting sample.

11. The beam adjusting device according to claim 8, wherein the beam generator applies the beam onto a microstructure placed on the surface of the beam adjusting sample.

12. The beam adjusting device according to claim 11, wherein a film of an element having a high electron stopping power is coated on the surface of the microstructure.

* * * * *